United States Patent [19]

Sandhu

[11] Patent Number: 5,599,396
[45] Date of Patent: Feb. 4, 1997

[54] HIGH DENSITY INDUCTIVELY AND CAPACITIVELY COUPLED PLASMA CHAMBER

[75] Inventor: Gurtej S. Sandhu, Boise, Id.

[73] Assignee: Micron Technology, Inc., Boise, Id.

[21] Appl. No.: 652,330

[22] Filed: May 22, 1996

Related U.S. Application Data

[62] Division of Ser. No. 395,269, Feb. 28, 1995, Pat. No. 5,523,261.

[51] Int. Cl.$^6$ .................................................. C23C 16/00
[52] U.S. Cl. .................................. 118/723 I; 118/723 E; 156/345
[58] Field of Search ........................... 118/723 I, 723 E; 156/345 C, 345 P; 134/1.1

[56] References Cited

U.S. PATENT DOCUMENTS

| | | | |
|---|---|---|---|
| 3,619,403 | 11/1971 | Gorin | 118/723 I |
| 4,368,092 | 1/1983 | Steinberg et al. | 156/345 |
| 5,171,369 | 12/1992 | Elwart et al. | 118/723 E |
| 5,252,178 | 10/1993 | Mosleti | 134/1.1 |
| 5,269,881 | 12/1993 | Sekiya et al. | 134/1.1 |
| 5,304,279 | 4/1994 | Coultas | 118/723 I |
| 5,309,063 | 5/1994 | Singh | 118/723 R |
| 5,370,737 | 12/1994 | Mathis | 118/723 E |
| 5,449,410 | 9/1995 | Chang et al. | 118/723 E |
| 5,449,432 | 9/1995 | Hanawa | 118/723 E |

OTHER PUBLICATIONS

Andrieu, X. et al., "New Conducting Polymer Networks", Journal of Power Sources, 43–44 (1993) pp. 445–451.

*Primary Examiner*—Robert Kunemund
*Assistant Examiner*—Ramamohan Rao Paladugu
*Attorney, Agent, or Firm*—Susan B. Collier

[57] ABSTRACT

An inductively coupled plasma chamber having a capacitor electrode during cleaning of the plasma chamber.

18 Claims, 1 Drawing Sheet

5,599,396

HIGH DENSITY INDUCTIVELY AND CAPACITIVELY COUPLED PLASMA CHAMBER

This application is a divisional of application Ser. No. 08/395,269, filed Feb. 28, 1995 now U.S. Pat. No. 5,523,261.

BACKGROUND OF THE INVENTION

A high plasma density chemical vapor deposition (CVD) is used to fill high aspect ratio spaces in-situ concurrent with a deposit to achieve gap fill. High plasma density CVD is also used for etching. In high density CVD a potential is coupled inductively to ionize a gas (plasma) in a CVD chamber. Once ionized the plasma is referred to as an inductively coupled plasma (ICP). In one application ICP is used to deposit dielectric films for gap fill.

One problem encountered when using an ICP process is the inability to adequately clean residue from the chamber after each deposition run or after each etch. In non-inductive systems chamber cleaning is accomplished using capacitive coupling of an electrical potential to a cleaning plasma which has been injected into the chamber. When using the inductively coupled design it is necessary to eliminate capacitive coupling during the inductive coupling, thereby making it difficult for plasmas to clean the chamber surfaces, since without capacitive coupling efficient cleaning is not possible.

SUMMARY OF THE INVENTION

The invention is an apparatus capable of depositing a layer onto a workpiece and capable of etching a portion from the workpiece and is the method to clean the apparatus. The apparatus has a support member extended from which is an enclosure portion. The support member and the enclosure portion form an enclosed chamber. The apparatus further comprises an external inductor which inductively ionizes a gas in the chamber during the etching and the deposition. The apparatus includes a means for generating a capacitively coupled plasma in the enclosed chamber during cleaning and a means for eliminating capacitive coupling during etching and depositing.

In the method of the invention a workpiece is inserted into a chamber. Gas injected into the chamber is inductively ionized. A chemical process, such as an etch or a deposition, is performed on the workpiece using the ionized gas. This chemical process creates debris, such as byproducts from the chemical process and residue, on a surface of the chamber. Plasma is then injected into the chamber and a potential is capacitively coupled to the plasma. The capacitively coupled plasma loosens the debris from chamber surfaces and the loosened debris is then removed from the chamber.

DETAILED DESCRIPTION OF THE INVENTION

Figure 1:
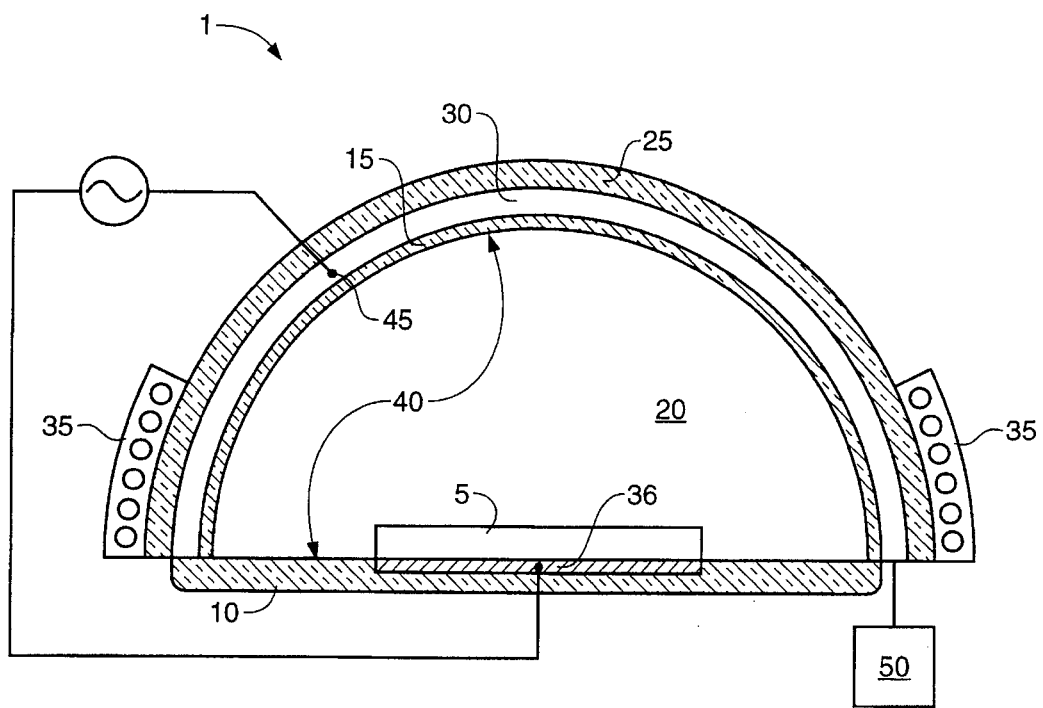
FIG. 1 is a cross sectional view of a chemical vapor deposition chamber of the invention.

FIG. 1 is cross sectional view of an inductively coupled plasma chamber 1 of the invention. A workpiece, typically a substrate 5, is supported on a support member 10. An inner wall 15 extends from the support member 10, typically near a periphery of the support member, to form an enclosed chamber 20. An outer wall 25 is concentric to and distanced from the inner wall 15 such that a void 30 or gap exists between the inner 15 and outer 25 walls. The support member 10, the inner wall 15, and the outer wall 25 are made from insulative materials. An inductor coil 35 is positioned exterior to the outer wall 25 surrounding the outer wall 25. The inductor coil 35 may or may not be physically attached to the outer wall 25. During deposition or etching of the substrate 5 deposition or etch gases are injected into the enclosed chamber 20. The gases are inductively ionized by the inductor coil 35 when current flows through the inductor coil 35.

Following the deposition or etching the enclosed chamber 20 is cleaned. During cleaning a plasma is generated in the enclosed chamber 20 and an electrical potential is capacitively coupled to the plasma by a capacitor having a first electrode formed in the void 30 and having a second electrode 36 positioned underlying the substrate 5 when the substrate 5 is positioned in the chamber 20. It should be noted that the exact position of the second electrode 36 may vary without departing from the inventive aspect. The charged plasma loosens debris, typically residue or byproducts produced during etching or deposition, from interior surfaces 40 of the enclosed chamber 20. The debris is then pumped out of the chamber. During cleaning the inductor 35 is turned off and no current flows therein.

In a first embodiment a conductive liquid, such as mercury or other liquid metal, is injected into the void 30 to form the first electrode 36. Other materials which may be used are liquid polymers, organic or inorganic. Upon injection the conductive liquid comes into contact with a supply node 45 connectable to a supply potential. The supply potential, which may supply alternating or direct current, charges the conductive liquid to an electrical potential. The charged conductive liquid provides capacitive coupling for the cleaning plasma.

In the first embodiment the conductive liquid is removed from the void subsequent to the cleaning of the enclosed chamber in preparation for the next deposition or etching step. Removal of the conductive liquid eliminates problems that would occur if current was induced into the liquid metal during inductive coupling.

In a second embodiment the void 30 is filled with a material having a variable conductivity. A polymer whose conductivity may be varied by a few orders of magnitude in response to external energy such as heat, light, or ultrasonic energy is one example of a material having variable conductivity. Examples of polymers which may be used are polyacetylene, polythiophenes, polypyrroles, polyaniline, and PEO/PPO (poly propylene oxide). An ionic solution, organic or inorganic, is an example of a further material which may be used. In the present embodiment a polymer is the material of variable conductivity.

By controlling the conductivity of the polymer it becomes either electrically insulative or electrically conductive. When it is electrically conductive it forms the first electrode 36. Unlike the conductive liquid the polymer remains in the void 30 during both the cleaning step and the deposition and etching steps. However, the conductivity of the polymer is varied in order to create an insulator in the void 30 during deposition and etching and in order to create a conductor during cleaning. Thus the polymer is charged during cleaning to capacitively couple a potential to the cleaning plasma and remains unaffected by the induced voltage during deposition and etching.

The polymer is connected to supply node 45 which is connectable to the supply potential. The supply potential is used to supply charge to the polymer during cleaning.

In certain embodiments the polymer is connected to an energy source 50. The energy source 50 is used to control the conductivity of the polymer.

There are various methods of the invention used to change the conductivity of the polymer. The energy source 50 may be used to control the temperature of the polymer when the conductivity of the polymer is sensitive to temperature. Typically, if the polymer is in an insulative state sufficient increase of the temperature of the polymer changes it to its conductive state, in some cases this occurs when the temperature is great enough to change the polymer from a solid to a liquid. If this temperature increase is followed by a sufficient temperature decrease the polymer is returned to the insulative state.

In a further method of the invention the energy source 50 supplies ultrasonic energy or light energy to the polymer to change it from an electrical insulator to an electrical conductor. Of course the reverse is also true. Once the polymer is electrically conductive the application of ultrasonic or light energy may be terminated to return the polymer to the insulative state for further process steps.

In still a further method the polymer is doped to increase its conductivity thereby changing it from an insulator to a conductor. In this application it is important to use one of the polymers in which doping is reversible in order to be able to also change the polymer from a conductor to an insulator.

In the case where the polymer remains in a solid state in both its insulative and conductive states it is possible to eliminate the outer wall 25.

The following article is herein incorporated by reference: NEW CONDUCTING POLYMER NETWORKS, by X. Andrieu, J. P. Boeuve and T. Vicedo, Journal of Power Sources, 43–44(1993) pages 445–451.

Thus the invention provides a high density inductively coupled plasma chamber in which a cleaning process is performed efficiently.

What is claimed is:

1. A chamber for operating on a workpiece, comprising:
   a) an enclosed chamber adapted to contain a gas;
   b) an inductive coil in electromagnetic communication with an interior of the chamber when energized; and
   c) a capacitor in electrostatic communication with the interior of the chamber when energized.

2. The chamber as specified in claim 1, further comprising a means for eliminating capacitive coupling during a generation of an inductively coupled plasma in the chamber.

3. The chamber as specified in claim 1, wherein
   a) an inductively coupled plasma is generated in the chamber during an operation performed on the workpiece; and
   b) wherein a capacitively coupled plasma is generated during a cleaning of the chamber.

4. The chamber as specified in claim 3, further comprising a means for eliminating capacitive coupling during a generation of the inductively coupled plasma.

5. The chamber as specified in claim 1, further comprising a means for eliminating capacitive coupling in the enclosed chamber.

6. An apparatus, comprising:
   a) at least two walls spaced relative to one another, a first of said walls at least partially defining an enclosed chamber adapted to contain a plasma;
   b) a capacitor electrode positioned between said walls; and
   c) an inductor coil in electromagnetic communication with an interior of the chamber when energized.

7. The apparatus as specified in claim 6, wherein said capacitor electrode capacitively couples a potential to a plasma in the enclosed chamber during a cleaning process.

8. The apparatus as specified in claim 6, wherein the capacitor electrode comprises a liquid which is removable from its position between said walls.

9. The apparatus as specified in claim 8, wherein said liquid is electrically conductive.

10. The apparatus as specified in claim 6, wherein the capacitor electrode comprises a material of variable conductivity.

11. The apparatus as specified in claim 10, wherein the material of variable conductivity is electrically insulative during electromagnetic induction.

12. The apparatus as specified in claim 10, where the material of variable conductivity is electrically conductive during cleaning of the enclosed chamber.

13. The apparatus as specified in claim 10, further comprising a temperature control unit for regulating a temperature of said material of variable conductivity, wherein a conductivity of said material of variable conductivity is dependent on temperature.

14. The apparatus as specified in claim 10, further comprising a means for supplying ultrasonic energy to said material of variable conductivity to change a conductivity thereof.

15. The apparatus as specified in claim 10, further comprising a means for supplying light energy to said material of variable conductivity to change a conductivity thereof.

16. The apparatus as specified in claim 10, wherein said material of variable conductivity is a polymer.

17. The apparatus as specified in claim 10, wherein a doping of said material of variable conductivity is varied to change a conductivity thereof.

18. The apparatus as specified in claim 6, wherein said capacitor electrode is connectable to a voltage supply.

* * * * *